(12) United States Patent
Choi et al.

(10) Patent No.: US 9,196,791 B2
(45) Date of Patent: Nov. 24, 2015

(54) LIGHT EMITTING DEVICE

(71) Applicant: LG INNOTEK CO., LTD., Seoul (KR)

(72) Inventors: Jae Hoon Choi, Seoul (KR); Young Jae Choi, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/262,513

(22) Filed: Apr. 25, 2014

(65) Prior Publication Data

US 2014/0327022 A1 Nov. 6, 2014

(30) Foreign Application Priority Data

May 6, 2013 (KR) .......................... 10-2013-0050798

(51) Int. Cl.
*H01L 33/00* (2010.01)
*H01L 33/12* (2010.01)
*H01L 33/24* (2010.01)
*H01L 33/02* (2010.01)
*H01L 33/22* (2010.01)

(52) U.S. Cl.
CPC .............. *H01L 33/12* (2013.01); *H01L 33/025* (2013.01); *H01L 33/22* (2013.01); *H01L 33/24* (2013.01)

(58) Field of Classification Search
CPC ...................................... H01L 33/0004–33/648
See application file for complete search history.

(56) References Cited

U.S. PATENT DOCUMENTS

| | | | |
|---|---|---|---|
| 6,437,374 B1 | 8/2002 | Northrup et al. | 257/103 |
| 2003/0016526 A1 | 1/2003 | Sakai et al. | 362/94 |
| 2010/0219445 A1* | 9/2010 | Yokoyama et al. | 257/101 |
| 2012/0074385 A1* | 3/2012 | Tak et al. | 257/15 |
| 2012/0292648 A1* | 11/2012 | Ono et al. | 257/94 |

FOREIGN PATENT DOCUMENTS

| | | |
|---|---|---|
| DE | 102 28 781 A1 | 1/2003 |
| DE | 10 2010 052 542 A1 | 5/2012 |
| EP | 2 360 745 A2 | 8/2011 |

OTHER PUBLICATIONS

European Search Report dated Sep. 15, 2014 issued in Application No. 14 166 548.9.

* cited by examiner

*Primary Examiner* — David Vu
*Assistant Examiner* — Cuong Nguyen
(74) *Attorney, Agent, or Firm* — KED & Associates LLP

(57) ABSTRACT

A light emitting device includes a substrate, a buffer layer, a first conductive layer, an active layer and a third conductive semiconductor layer. The first conductive layer has a prescribed tensile stress, and a second conductive semiconductor layer has a prescribed compressive stress.

20 Claims, 11 Drawing Sheets

LIGHT EMITTING DEVICE

CROSS-REFERENCE TO RELATED APPLICATION

This application claims under 35 U.S.C. §119 to Korean Patent Application No. 10-2013-0050798 filed on May 6, 2013, which is hereby incorporated by reference in its entirety.

BACKGROUND

1. Field

The embodiment relates to a light emitting device.

2. Background

Various electronic devices or light emitting devices using compound semiconductor have been developed.

The electronic device may include a solar cell, a light detector or an electric power device.

Such an electronic device or a light emitting device may be fabricated based on a semiconductor substrate. The semiconductor substrate includes a growth substrate and a compound semiconductor layer grown from the growth substrate.

In such a semiconductor substrate, various defects may be caused due to the lattice mismatch and difference in the thermal expansion coefficient between the growth substrate and the compound semiconductor layer.

A dislocation is caused in the semiconductor substrate according to the related art due to the lattice constant difference between the growth substrate and the compound semiconductor layer, so that the crystallinity is deteriorated.

In addition, due to the difference between the thermal expansion coefficients of the growth substrate and the compound semiconductor layer, strain is generated so that a crack is caused in the compound semiconductor layer due to the strain or the growth substrate is broken.

Since the crack is caused in the compound semiconductor layer of the semiconductor substrate according to the related art, it is difficult to thickly grow a semiconductor layer performing a practical function of a light emitting device or an electronic device in good quality.

BRIEF DESCRIPTION OF THE DRAWINGS

The embodiments will be described in detail with reference to the following drawings in which like reference numerals refer to like elements wherein.

DETAILED DESCRIPTION OF THE EMBODIMENTS

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

(Embodiment)

Figure 1:
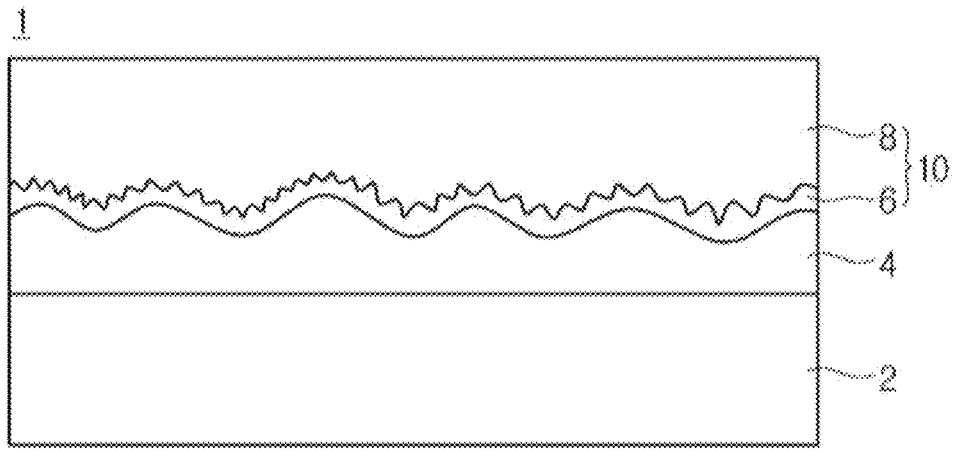
FIG. 1 is a sectional view showing a semiconductor substrate according to the first embodiment.

FIG. 1 is a sectional view showing a semiconductor substrate according to the first embodiment.

Referring to FIG. 1, the semiconductor substrate 1 according to the first embodiment may include a growth substrate 2, a buffer layer 4 and a conductive layer 10.

The buffer layer 4 and the conductive layer 10 may be formed of group III-V or group II-VI compound semiconductor. For example, the buffer layer 4 and the conductive layer 10 may include at least one selected from the group consisting of InAlGaN, GaN, AlGaN, InGaN, AlN, InN and AlInN, but the embodiment is not limited thereto.

The growth substrate 2 is used to grow the conductive layer 10 while supporting the conductive layer 10. The growth substrate 2 may include a material suitable to grow a semiconductor material. The growth substrate 2 may include a material having thermal stability and a lattice constant approximate to that of the conductive layer 10. The growth substrate 1 may be one of a conductive substrate, a compound semiconductor substrate and an insulating substrate, but the embodiment is not limited thereto.

The growth substrate 2 may include at least one selected from the group consisting of sapphire ($Al_2O_3$), SiC, Si, GaAs, GaN, ZnO, GaP, InP and Ge.

The growth substrate 2 may include dopants such that the growth substrate 2 has conductivity, but the embodiment is not limited thereto. The growth substrate 2 including the dopants may serve as an electrode layer, but the embodiment is not limited thereto.

The buffer layer 4 may be interposed between the growth substrate 2 and the conductive layer 10, but the embodiment is not limited thereto.

The buffer layer 4 may reduce the difference between the lattice constants of the growth substrate 2 and the conductive layer 10. In addition, the buffer layer 4 may prevent the material of the growth substrate 2 from being diffused into the conductive layer 10, prevent a melt-back phenomenon such as a recess formed in the top surface of the growth substrate 2, or prevent the growth substrate 2 from being broken by controlling strain, but the embodiment is not limited thereto.

The buffer layer 4 may be formed on the growth substrate 2 and the conductive layer 10 may be formed on the buffer layer 4. That is, the buffer layer 4 may be formed between the growth substrate 2 and the conductive layer 10.

To satisfy various functions of the buffer layer 4 described above, the buffer layer 4 may be formed of compound semiconductor including Al. For example, the buffer layer 4 may include AlN or InAlGaN, but the embodiment is not limited thereto.

Due to Al, the top surface of the buffer layer 4 may be very rough. As the content of Al is increased, the surface roughness may be increased. In this case, the surface roughness may signify the thickness of concaves in the surface of the buffer layer 4, but the embodiment is not limited thereto.

For example, the surface roughness of the buffer layer 4 may be in the range of several tens of μm to several hundreds of nm. For example, the surface roughness of the buffer layer 4 may be in the range of 50 nm to 500 nm, but the embodiment is not limited thereto.

The conductive layer 10 may be formed on the buffer layer 4. The conductive layer 10 may include a nitride semiconductor layer including a dopant, but the embodiment is not limited thereto.

The conductive layer 10 may include at least two layers, but the embodiment is not limited thereto.

The conductive layer 10 may include a first conductive semiconductor layer 6 formed on the buffer layer 4 and a second conductive semiconductor layer 8 formed on the first conductive semiconductor layer 6.

The first and second conductive semiconductor layers 6 and 8 may be formed of compound semiconductor materials, the types of which are different from or equal to each other.

For example, the first and second conductive semiconductor layers 6 and 8 may include GaN, respectively, but the embodiment is not limited thereto.

For example, the first conductive semiconductor layer 6 may include AlGaN and the second conductive semiconductor layer 8 may include GaN, but the embodiment is not limited thereto. Differently from the above, the first conductive semiconductor layer 6 may include GaN and the second conductive semiconductor layer 8 may include AlGaN, but the embodiment is not limited thereto.

The first and second conductive semiconductor layers 6 and 8 may include at least one dopant, the types of which are different from each other, but the embodiment is not limited thereto.

The first conductive semiconductor layer 6 may include a first dopant and the second conductive semiconductor layer 8 may include a second dopant.

For example, the first dopant of the first conductive semiconductor layer 6 may have a tensile stress and the second dopant of the second conductive semiconductor layer 8 may have a compressive stress, but the embodiment is not limited thereto.

The second conductive semiconductor layer 8 may compensate for the stress of the first conductive semiconductor layer 6. That is, due to the tensile stress of the first conductive semiconductor layer 6, the balance of stress (in which the intensity of tensile stress is equal or almost similar to the intensity of compressive stress) is not achieved when the cooling down is performed in the subsequent process, so that crack may be generated in the conductive layer or the growth substrate may be broken.

Therefore, to solve the above problem, the second conductive semiconductor layer 8 having the compressive stress opposite to the tensile stress of the first conductive semiconductor layer 6 is formed, so that the balance of stress is achieved when the cooling down is performed in the subsequent process, so any crack is not generated in the conductive layer 10 and the growth substrate 2 is not broken.

The first and second dopants may be dopants having the same polarity, that is, N-type dopants, but the embodiment is not limited thereto.

For example, the first dopant may include Si and the second dopant may include at least one of Si, Ge, Sn, Se and Te, but the embodiment is not limited thereto.

In order to commercialize the semiconductor substrate, high concentration of Si must be doped. For example, the doping concentration of Si may be in the range of 1E18 to 2E19, the embodiment is not limited thereto.

A silane ($SiH_4$) gas is injected into a chamber so that the silane gas may be doped into the first conductive semiconductor layer 6 as Si dopant.

However, it is difficult to dope the first conductive semiconductor layer 6 with the Si dopant at the maximum of 2E19 or more.

In addition, as the first conductive semiconductor layer 6 is doped with the Si dopant at high concentration, the number and density of dislocations are increased in the first conductive semiconductor layer 6, so that the product yield may be reduced due to product defects.

According to the first embodiment, the second conductive semiconductor layer 8, which includes the second dopant, that is, at least one of Ge, Sn, Se and Te having the compressive stress, may be formed on the first conductive semiconductor layer 6 including Si.

Thus, the compressive stress of the second conductive semiconductor layer 8 may compensate for the tensile stress which is due to the first conductive semiconductor layer 6 and may be doped with the dopant at higher concentration than that of the first conductive semiconductor layer 6. In addition, the number and density of dislocations may be reduced.

Figure 2:
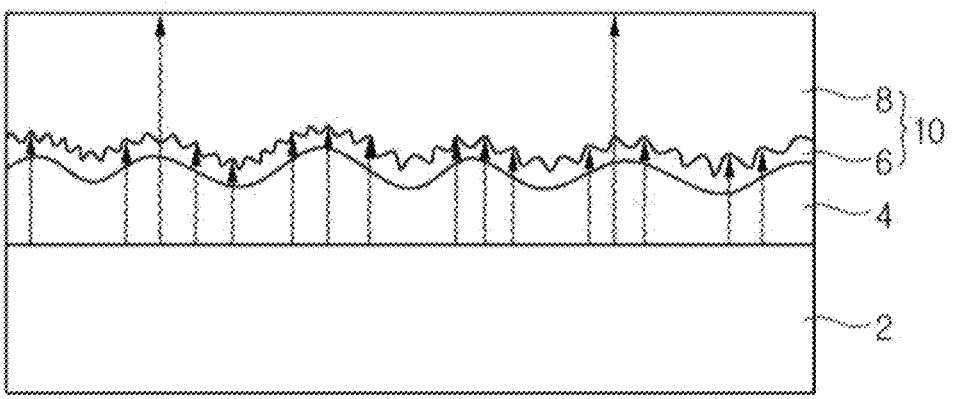
FIG. 2 is a view illustrating a dislocation blocking in the semiconductor substrate of FIG. 1.

As shown in FIG. 2, the dislocation rising up along the buffer layer 4 rises through the first conductive semiconductor layer 6. However, the second conductive semiconductor layer 8 may block most of the dislocations of the first conductive semiconductor layer 6.

As described above, the reason of blocking the dislocations by the second conductive semiconductor layer 8 is that the second conductive semiconductor layer 8 is grown on the first conductive semiconductor layer 6 in a LOG (Lateral Overgrowth) scheme.

That is, since the first conductive semiconductor layer 6 is formed on the buffer layer 4 having very great surface roughness, the surface of the first conductive semiconductor layer 6 becomes also rough. The surface of the first conductive semiconductor layer 6 may be formed in a shape corresponding to the shape of the surface of the buffer layer 4. A concave size of the surface of the second conductive semiconductor layer 8 may be less than that of the surface of the first conductive semiconductor layer 6.

The first conductive semiconductor layer 6 may have a thickness in the range of 10 nm to 5 μm, but the embodiment is not limited thereto.

The thickness of the first conductive semiconductor layer 6 may be less than that of the buffer layer 4, but the embodiment is not limited thereto.

Figure 4A:
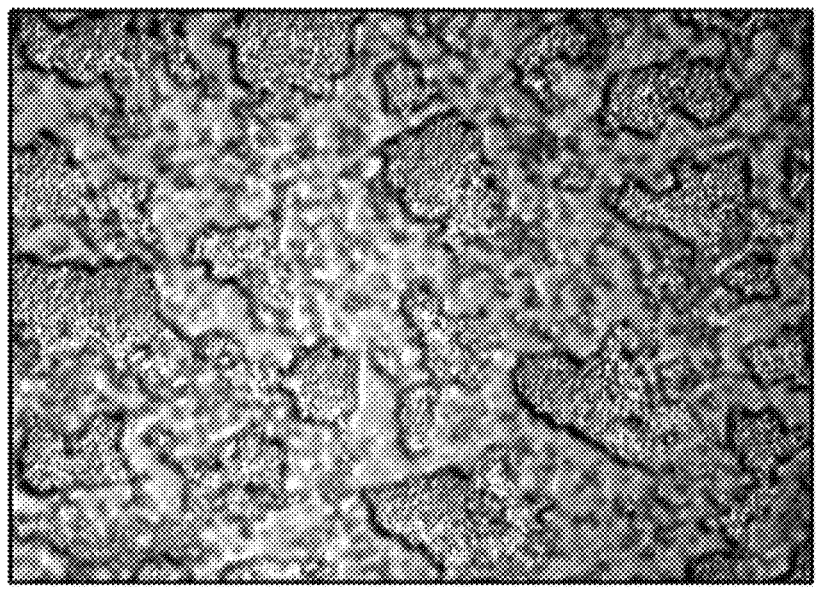
FIG. 4A is a view showing a semiconductor layer including Si.

As shown in FIG. 4A, the surface of Si—GaN such as the first conductive semiconductor layer 6 is not smooth but rough. When the Si—GaN having the rough surface is employed in a light emitting device or electronic device, the optical/electrical properties may be deteriorated.

As described above, when the second conductive semiconductor layer 8 is grown on the first conductive semiconductor layer 6 having a rough surface, the semiconductor layer is subject to the 2-D growth, that is, the semiconductor layer is grown upward from a valley at which the lowest point of the concavo-convex section of the first conductive semiconductor layer 6 is located, and then the semiconductor layer, which is grown from the valleys adjacent to the mountain at which the highest point of the concavo-convex section of the first conductive semiconductor layer 6 is located, is grown in a horizontal direction. In this case, the proceeding direction of the dislocation rising up along the first conductive semiconductor layer 6 in a vertical direction is changed into the growing direction of the second conductive semiconductor layer 8, that is, the horizontal direction, so that the dislocation does not proceed in the vertical direction. Therefore, dislocations are rarely generated in the second conductive semiconductor layer 8.

In addition, the second conductive semiconductor layer 8 is formed by using N-type dopants except for Si, so that the second conductive semiconductor layer 8 has a planer surface.

Figure 4B:
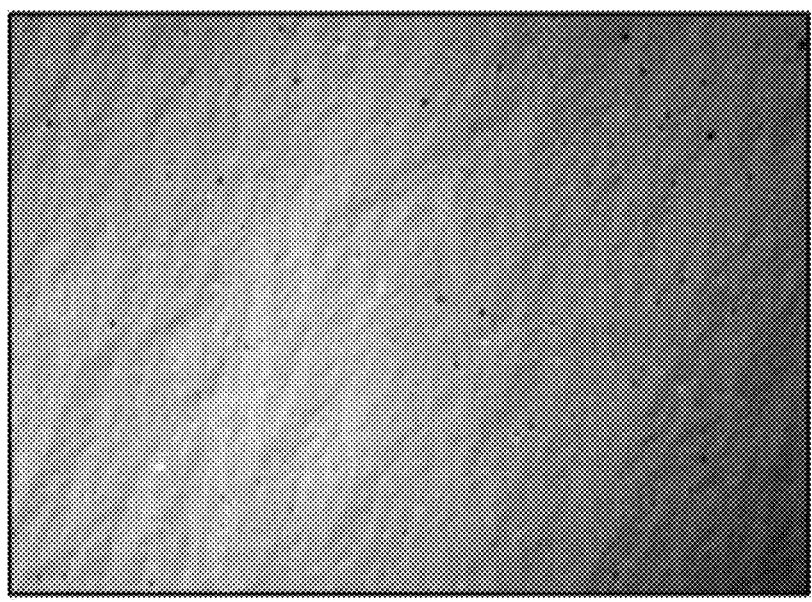
FIG. 4b is a view showing a surface state of a semiconductor layer including Ge.

As shown in FIG. 4B, when a Ge—GaN layer is formed by the second conductive semiconductor layer 8, the surface of Ge—GaN layer is very smooth and planar as compared with the surface of Si—GaN depicted in FIG. 4A.

Thus, the dislocation is blocked by the second conductive semiconductor layer 8, so that the crystallinity is improved and the layer quality is excellent, thereby improving the electrical/optical properties.

The second conductive semiconductor layer 8 may be doped with the second dopant at the doping concentration in the range of 1E19 to 3E20. The doping concentration of the second dopant in the second conductive semiconductor layer 8 may be 10 times to 15 times greater than that of the first dopant in the first conductive semiconductor layer 6. In other words, the second conductive semiconductor layer 8 may compensate for the limitation of Si doping in the first conductive semiconductor layer 6, so that the low-current property and the reliability may be improved.

The second conductive semiconductor layer 8 may have a thickness in the range of 10 nm to 5 μm, but the embodiment is not limited thereto.

The thickness of the second conductive semiconductor layer 8 is thicker than that of the first conductive semiconductor layer 6, but the embodiment is not limited thereto.

Therefore, the relationship between the thicknesses of the first and second conductive semiconductor layers 6 and 8 may be expressed as follows, but the embodiment is not limited thereto.

Figure 3:
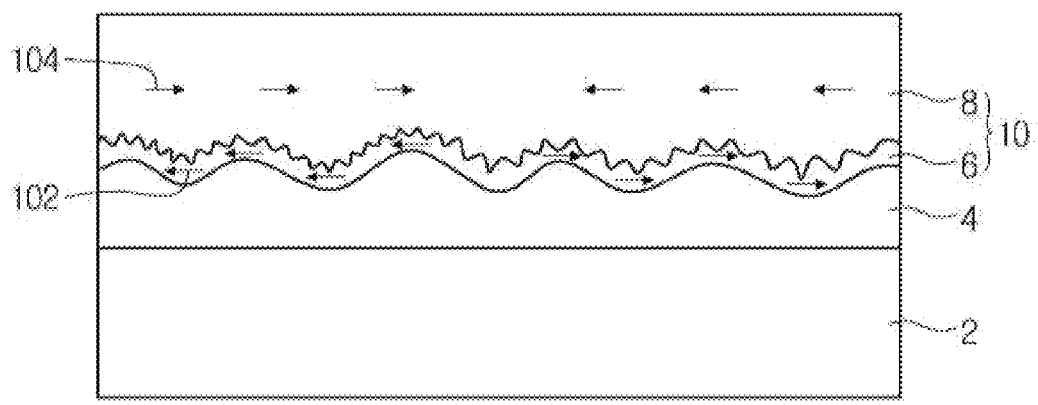
FIG. 3 is a view illustrating a strain control in the semiconductor substrate of FIG. 1.

10 nm<First conductive semiconductor layer 6 Second conductive semiconductor layer 8<5 μm As shown in FIG. 3, although to the tensile stress is generated by the first conductive semiconductor layer 6, the compressive stress by the second conductive semiconductor layer 8 may compensate for the tensile stress of the first conductive semiconductor layer 6, so that the balance of stress may be maintained when the cooling down is performed in the subsequent process, so crack may be prevented from being generated or the growth substrate 2 may be prevented from being broken.

Figure 5:
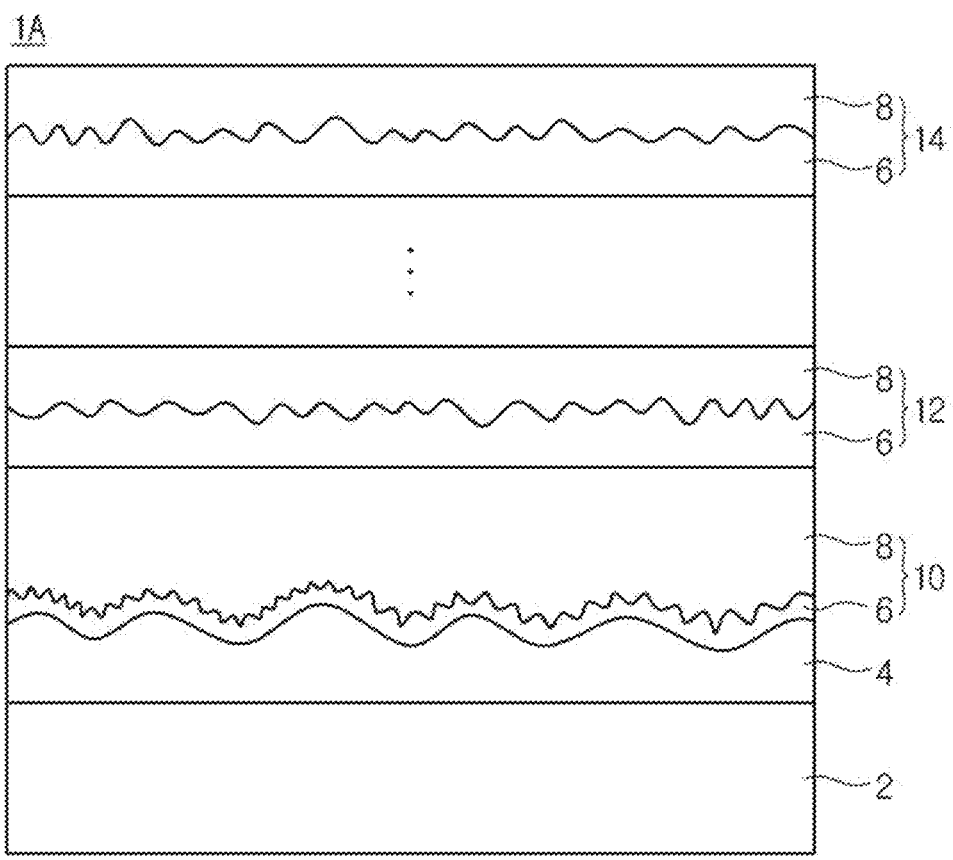
FIG. 5 is a sectional view showing a semiconductor substrate according to the second embodiment.

FIG. 5 is a sectional view showing a semiconductor substrate according to the second embodiment.

The second embodiment is equal to the first embodiment except including a plurality of conductive layers 10, 12 and 14. In the following description of the second embodiment, the same reference numerals will be assigned to the same elements having the same shape or function as those of the first embodiment and the details thereof will be omitted.

Referring to FIG. 5, the semiconductor substrate 1A according to the second embodiment may include a growth substrate 2, a buffer layer 4 and the plurality of conductive layers 10, 12 and 14.

Each of the conductive layers 10, 12 and 14 may include a first conductive semiconductor layer 6 and a second conductive semiconductor layer 8 formed on the first conductive semiconductor layer 6.

The first conductive semiconductor layer 6 may include Si and the second conductive semiconductor layer 8 may include, for example, Ge which causes a compressive stress greater than that of Si, but the embodiment is not limited thereto.

The plurality of conductive layers 10, 12 and 14 may be continuously formed on the buffer layer 4. That is, the conductive layers 10, 12 and 14 may be formed N times. This may signify that the conductive layers are formed with N periodicities based on one periodicity of the first and second conductive semiconductor layers 6 and 8.

The N times may be in the range of 10 times to 100 times, but the embodiment is not limited thereto.

The total thickness of the conductive layers 10, 12 and 14 repeated N times may be less than 10 μm, but the embodiment is not limited thereto.

For example, when the thickness of the conductive layers 10, 12 and 14, each of which includes the first and second conductive semiconductor layers 6 and 8, is 200 nm, the conductive layers may be repeatedly formed 50 times or less, but the embodiment is not limited thereto.

According to the second embodiment, a plurality of conductive layers 10, 12 and 14 are formed so that the dislocations can be more perfectly blocked. Thus, it may be easy to control the stress, so that the growth substrate 2 can be prevented from being broken and cracks may be minimized.

Figure 6:
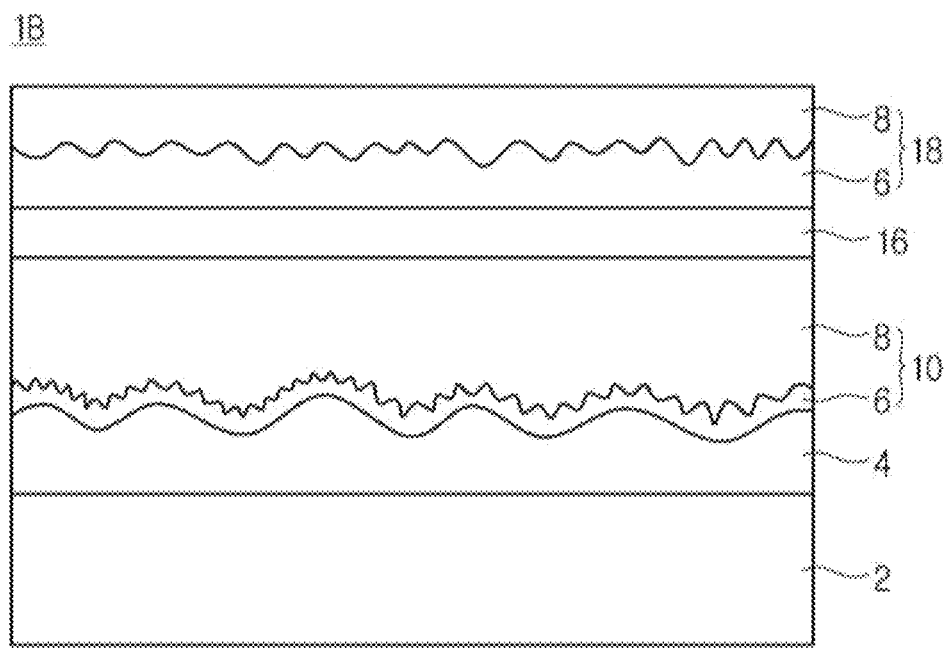
FIG. 6 is a sectional view showing a semiconductor substrate according to the third embodiment.

FIG. 6 is a sectional view showing a semiconductor substrate according to the third embodiment.

Referring to FIG. 6, the semiconductor substrate 1B according to the third embodiment may include a growth substrate 2, a buffer layer 4 and a first conductive layer 10, a non-conductive semiconductor layer 16 and a second conductive layer 18.

Each of the first and second conductive layers 10 and 18 may include first conductive semiconductor layer 6 and a second conductive semiconductor layer 8 formed on the first conductive semiconductor layer 6.

The first conductive semiconductor layer 6 may include a first dopant and the second conductive semiconductor layer 8 may include a second dopant.

The first and second dopants may be dopants having the same polarity, that is, N-type dopants, but the embodiment is not limited thereto.

For example, the first dopant may include Si having a tensile stress, but the embodiment is not limited thereto. For example, the second dopant may include at least one of Ge, Sn, Se and Te having a compressive stress, but the embodiment is not limited thereto The non-conductive semiconductor layer 16 may be formed between the first and second conductive layers 10 and 18, but the embodiment is not limited thereto.

The non-conductive semiconductor layer 16 may not include any dopants.

The non-conductive semiconductor layer 16 may be formed of group III-V or group II-VI compound semiconductor. For example, the non-conductive semiconductor layer 16 may include at least one selected from the group consisting of InAlGaN, GaN, AlGaN, InGaN, AlN, InN and AlInN, but the embodiment is not limited thereto.

The non-conductive semiconductor layer 16 may have a surface flatter than that of the first conductive layer 10, that is, the second conductive semiconductor layer 8, but the embodiment is not limited thereto. In other words, the surface roughness of the non-conductive semiconductor layer 16 may be less than that of the second conductive semiconductor layer 8 of the first conductive layer 10.

As the surface of the non-conductive semiconductor layer 16 is more flattened, the surface of the second conductive semiconductor layer 8 of the second conductive layer 18 formed on the non-conductive semiconductor layer 16 may further have a flatness greater than that of the surface of the non-conductive semiconductor layer 16.

According to the second embodiment, the flatness of the second conductive layer 18 formed on the non-conductive semiconductor layer 16 may be improved by forming the non-conductive semiconductor layer 16 which can improve the flatness on the first conductive layer 10, so that the crystallinity is improved, so the optical/electrical properties may be improved.

Figure 7:
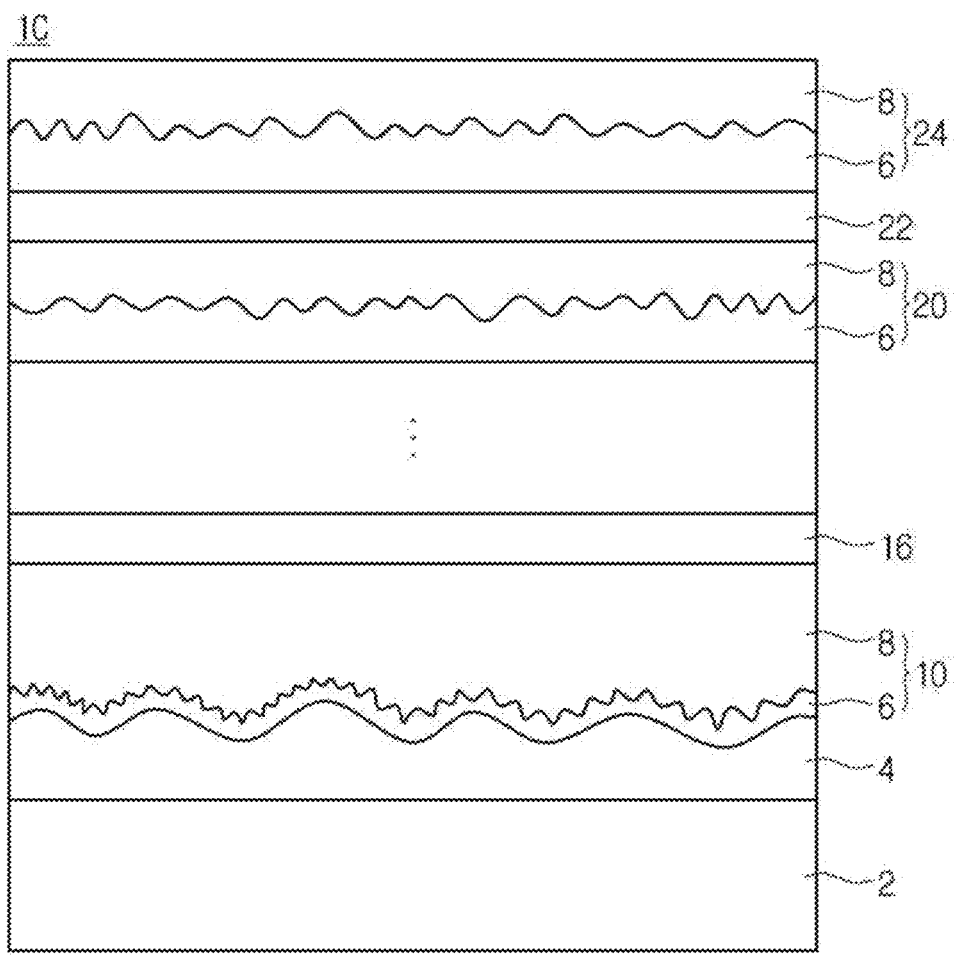
FIG. 7 is a sectional view showing a semiconductor substrate according to the fourth embodiment.

FIG. 7 is a sectional view showing a semiconductor substrate according to the forth embodiment.

The fourth embodiment is almost similar to the third embodiment except that conductive layers 10, 20 and 24 and non-conductive semiconductor layers 16 and 22 are repeatedly formed. In the fourth embodiment, the same reference numerals will be assigned to the same functions and shapes as those of the third embodiment and the details will be omitted.

Referring to FIG. 7, the semiconductor substrate 1C according to the fourth embodiment may include a growth substrate 2, a buffer layer 4, a plurality of conductive layers 10, 20 and 24, and a plurality of non-conductive semiconductor layers 16 and 22, each of which is formed between a plurality of conductive layers 10, 20 and 24.

The conductive layers 10, 20 and 24, and the non-conductive semiconductor layers 16 and 22 may be alternatively formed on the buffer layer 4.

The uppermost layer of the semiconductor substrate 1C may be the conductive layer 24, but the embodiment is not limited thereto.

Since the conductive layers 10, 20 and 24, and the non-conductive semiconductor layers 16 and 22 are alternatively formed, the surface flatness of the conductive layer 24 which is the uppermost layer of the semiconductor substrate 1C may be maximized.

In addition, since the conductive layers 10, 20 and 24, and the non-conductive semiconductor layers 16 and 22 are alternatively formed, a dislocation can be blocked, so that the growth substrate 2 can be prevented from being broken and cracks may be minimized.

Figure 8:
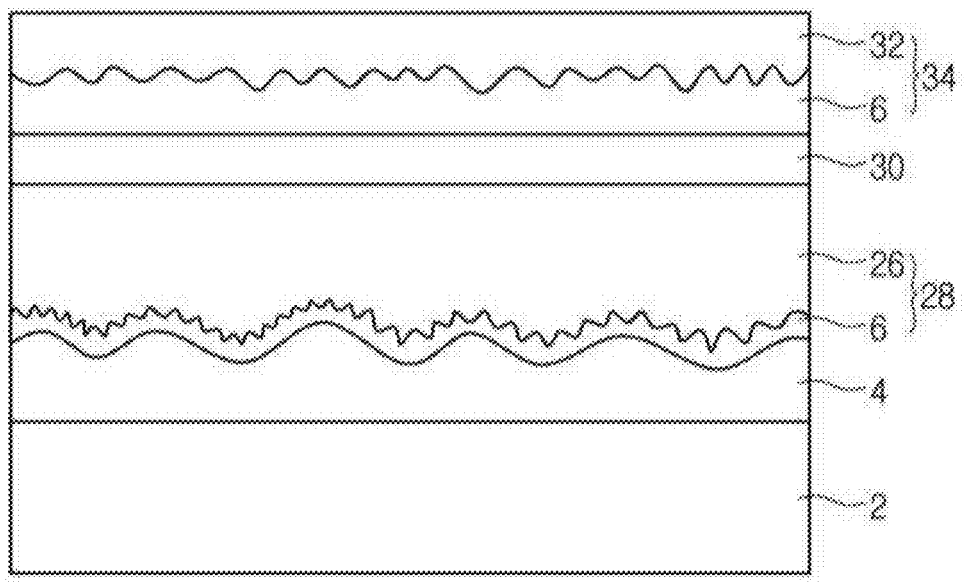
FIG. 8 is a sectional view showing a semiconductor substrate according to the fifth embodiment.

FIG. 8 is a sectional view showing a semiconductor substrate according to the fifth embodiment.

The fifth embodiment is almost similar to the third embodiment except that conductive layers 28 and 34 include at least one dopant of which the kinds are different from each other. In the fifth embodiment, the same reference numerals will be assigned to the same functions and shapes as those of the third embodiment and the details will be omitted.

Referring to FIG. 8, the semiconductor substrate 1D according to the fifth embodiment may include a growth substrate 2, a buffer layer 4, a plurality of conductive layers 28 and 34, and a plurality of non-conductive semiconductor layers 30, each of which is formed between a plurality of conductive layers 28 and 34.

Each of the first and second conductive layers 28 and 34 may include second conductive semiconductor layers 26 and 32 formed on the first conductive semiconductor layer 6.

The first conductive semiconductor layer 6 may include a first dopant and the second conductive semiconductor layers 26 and 32 may include a second dopant.

The first and second dopants may be dopants having the same polarity, that is, N-type dopants, but the embodiment is not limited thereto.

For example, the first dopant may include Si having a tensile stress, but the embodiment is not limited thereto. For example, the second dopant may include at least one of Ge, Sn, Se and Te having a compressive stress, but the embodiment is not limited thereto.

The non-conductive semiconductor layer 30 may be formed between the first and second conductive layers 28 and 34, but the embodiment is not limited thereto.

For example, the first conductive semiconductor layer 6 of each of the first and second conductive layers 28 and 34 may include a dopant having a compressive stress, for example, only Si having the concentration of 100%, but the embodiment is not limited thereto.

Each of the second conductive semiconductor layers 26 and 32 of the first and second conductive layers 28 and 34 may include at least one dopant, the types of which are different from each other.

For example, one of at least one dopant, the types of which are different from each other, may include a dopant, the kind of which is the same as that of the dopant included in the first conductive semiconductor layer 6, and another dopant may include a dopant, the kind of which is different from that of the dopant included in the first conductive semiconductor layer 6, that is, at least one of Ge, Sn, Se and Te having a tensile stress, but the embodiment is not limited thereto.

For example, each of the second conductive semiconductor layers 26 and 28 of the first and second conductive layers 28 and 34 may include Si and Ge, but the embodiment is not limited thereto.

The concentration of at least one dopant, the kinds of which are different from each other, may be changed in the thickness direction, but the embodiment is not limited thereto.

Figure 9:
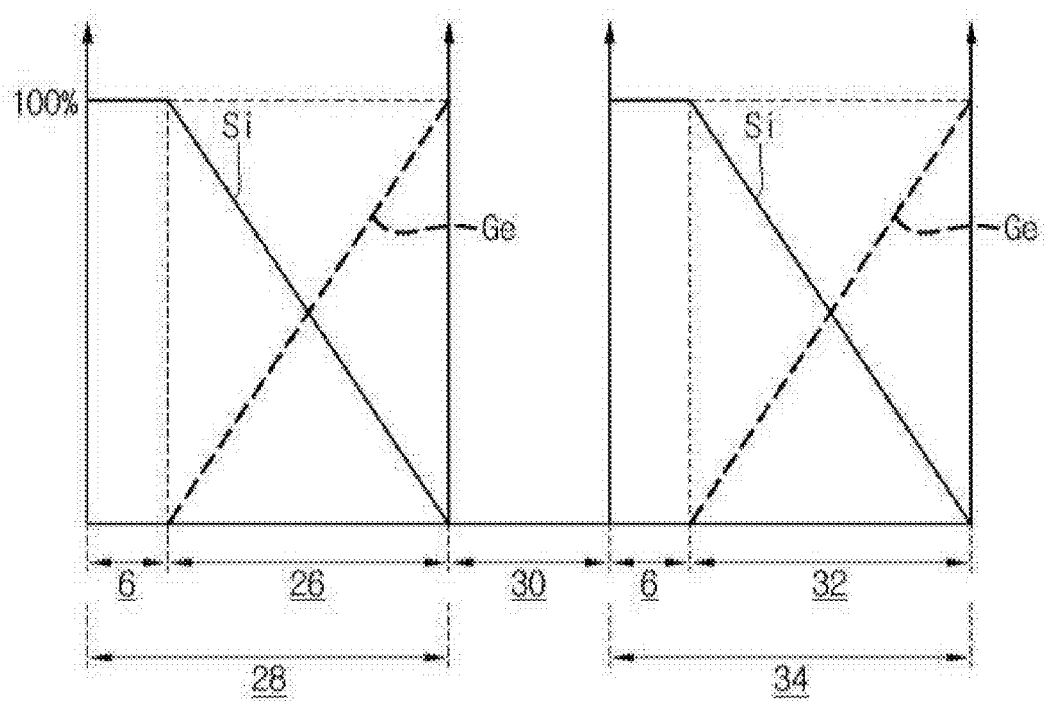
FIG. 9 is a view showing the first example of concentration distributions of Si and Ge in the semiconductor substrate of FIG. 8.

For example, as shown in FIG. 9, the concentration of Si may be linearly decreased from 100% to 0% in the thickness direction of the second conductive semiconductor layers 26 and 32 and the concentration of Ge may be linearly increased from 0% to 100% in the thickness direction of the second conductive semiconductor layers 26 and 32, but the embodiment is not limited thereto.

Meanwhile, Ge may be included from the rear surface of the non-conductive semiconductor layer 30 making contact with the second conductive semiconductor layer 26 at a depth, but the embodiment is not limited thereto. That is, Ge may be included at the depth of 10%~20% of the thickness of the non-conductive semiconductor layer 30 from the rear surface of the non-conductive semiconductor layer 30, but the embodiment is not limited thereto. Meanwhile, any dopants may not be included at a depth in the range of 10%~20% to 80%~90% of the thickness of the non-conductive semiconductor layer 30, and Si may be included at the depth of 80%~90% of the thickness of the non-conductive semiconductor layer 30 from the top surface of the non-conductive semiconductor layer 30, but the embodiment is not limited thereto.

The above can be expressed as following Table 1.

TABLE 1

| Non-conductive type | Definition | Dopant |
| --- | --- | --- |
| Lower area | Depth of 10%~20% of thickness of non-conductive semiconductor layer 30 from rear surface of non-conductive semiconductor layer 30 | Ge |
| Central area | Depth of 10%~20% to 80%~90% of thickness of non-conductive semiconductor layer 30 | Non |
| Upper area | Top surface of second conductive semiconductor layer 26 from depth of 80%~90% of thickness of non-conductive semiconductor layer 30 | Si |

The concentration of Ge may vary linearly or non-linearly in the lower area and the concentration of Si may vary linearly or non-linearly in the upper area, but the embodiment is not limited thereto.

Since the second conductive semiconductor layers 26 and 32 include the same dopant as that of the first conductive semiconductor layer 6, it is easy to form the second conductive semiconductor layers 26 and 32. Further, as the concentration of the dopant equal to the dopant included in the first conductive semiconductor layer 6 is decreased from the rear surfaces of the second conductive semiconductor layers 26 and 32, the tensile stress may be reduced and the compressive stress may be increased as the concentration of Ge is increased, so that the compressive stresses of the second conductive semiconductor layers 26 and 32 may be entirely increased, thereby compensating for the tensile stress of the first conductive semiconductor layer 6.

Figure 10:
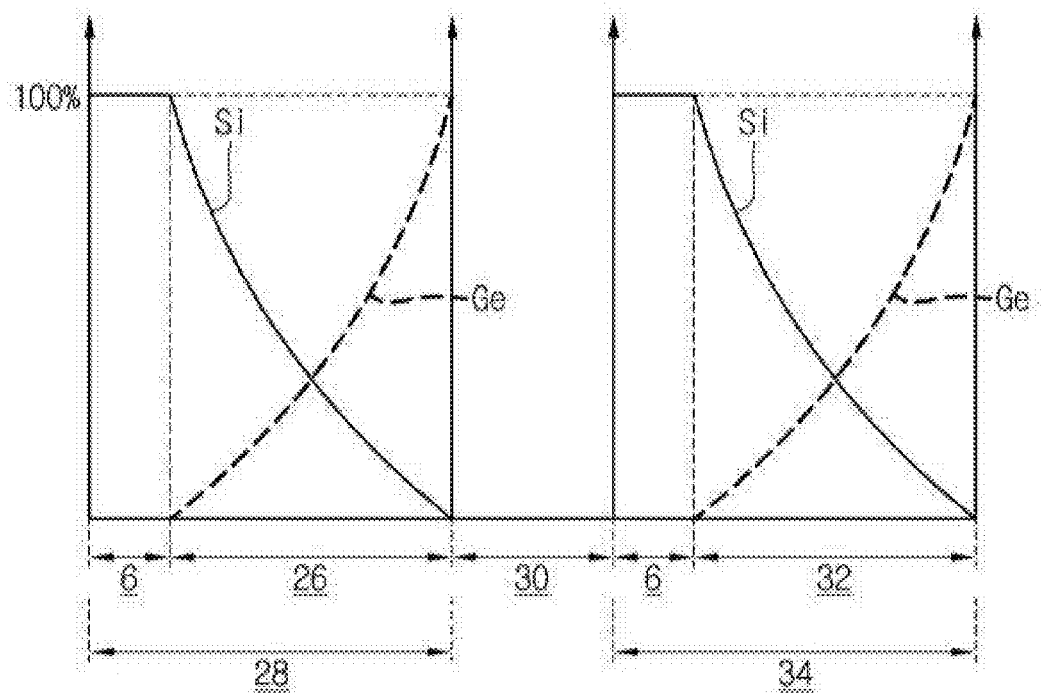
FIG. 10 is a view showing the second example of concentration distributions of Si and Ge in the semiconductor substrate of FIG. 8.

For example, as shown in FIG. 10, the concentration of Si may be non-linearly decreased from 100% to 0% in the thickness direction of the second conductive semiconductor layer 26 or 32, and the concentration of Ge may be non-linearly increased from 0% to 100% in the thickness direction of the second conductive semiconductor layer 26 or 32, but the embodiment is not limited thereto.

That is, the concentration of Si may be decreased downwardly in a concave non-linear manner, and the concentration of Ge may be increased downwardly in a concave non-linear manner. In other words, the concentration of Si may be decreased at a relatively high rate from the rear surface of the second conductive semiconductor layer 26 or 32, and then the concentration of Si may be decreased at a relatively low rate toward the top surface of the second conductive semiconductor layer 26 or 32. To the contrary, the concentration of Ge may be increased at a relatively low rate from the rear surface of the second conductive semiconductor layer 26 or 32, and then the concentration of Ge may be increased at a relatively high rate toward the top surface of the second conductive semiconductor layer 26 or 32.

Figure 11:
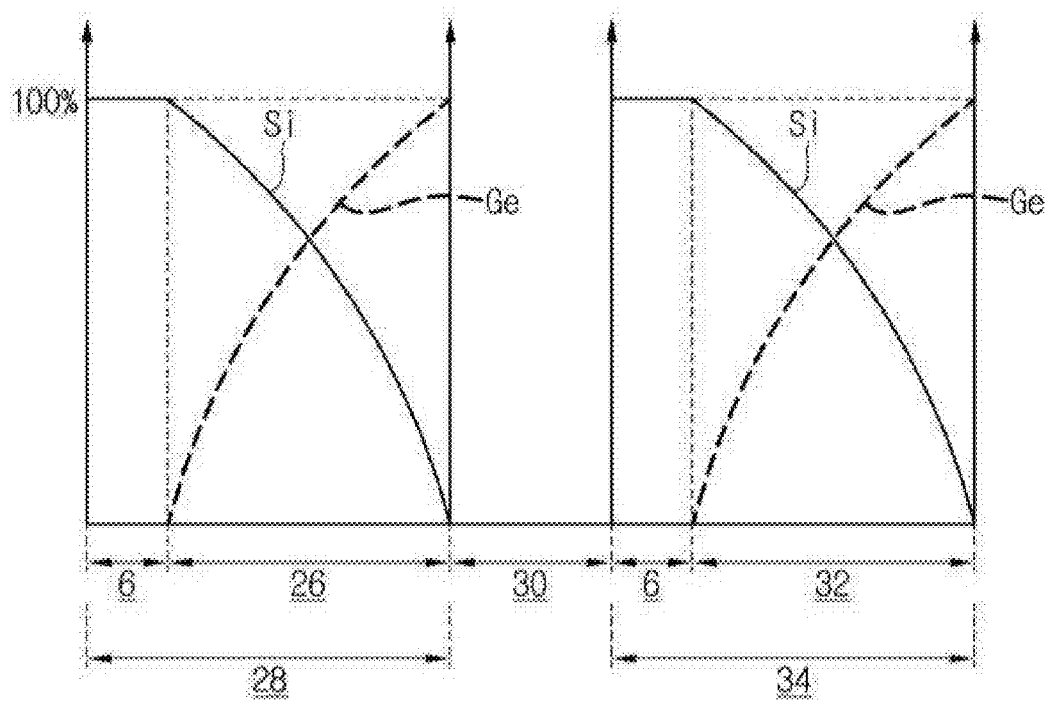
FIG. 11 is a view showing the third example of concentration distributions of Si and Ge in the semiconductor substrate of FIG. 8.

For example, as shown in FIG. 11, the concentration of Si may be non-linearly decreased from 100% to 0% in the thickness direction of the second conductive semiconductor layer 26 or 32, and the concentration of Ge may be non-linearly increased from 0% to 100% in the thickness direction of the second conductive semiconductor layer 26 or 32, but the embodiment is not limited thereto.

That is, the concentration of Si may be decreased upwardly in a convex non-linear manner, and the concentration of Ge may be increased upwardly in a convex non-linear manner. In other words, the concentration of Si may be decreased at a relatively low rate from the rear surface of the second conductive semiconductor layer 26 or 32, and then the concentration of Si may be decreased at a relatively high rate toward the top surface of the second conductive semiconductor layer 26 or 32. To the contrary, the concentration of Ge may be increased at a relatively high rate from the rear surface of the second conductive semiconductor layer 26 or 32, and then the concentration of Ge may be increased at a relatively low rate toward the top surface of the second conductive semiconductor layer 26 or 32.

Figure 12:
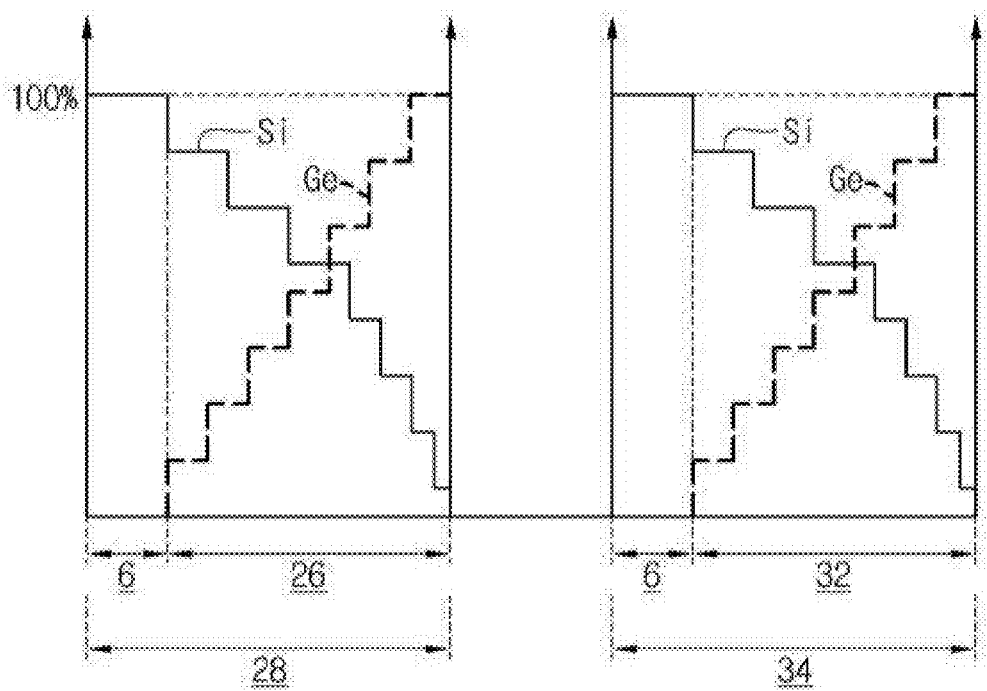
FIG. 12 is a view showing the fourth example of concentration distributions of Si and Ge in the semiconductor substrate of FIG. 8.

For example, as shown in FIG. 12, the concentration of Si may be decreased stepwise from 100% to 0% in the thickness direction of the second conductive semiconductor layer 26 or 32, and the concentration of Ge may be increased stepwise from 0% to 100% in the thickness direction of the second conductive semiconductor layer 26 or 32, but the embodiment is not limited thereto.

That is, the concentration of Si may be decreased stepwise, and the concentration of Ge may be increased stepwise. In other words, the concentration of Si may be gradually decreased in multi-steps toward the top surface of the second conductive semiconductor layer 26 or 32 from the rear surface of the second conductive semiconductor layer 26 or 32. To the contrary, the concentration of Ge may be gradually increased in multi-steps toward the top surface of the second conductive semiconductor layer 26 or 32 from the rear surface of the second conductive semiconductor layer 26 or 32.

Meanwhile, although not shown in the drawing, the fifth embodiment may be incorporated with the fourth embodiment, but the embodiment is not limited thereto.

Figure 13:
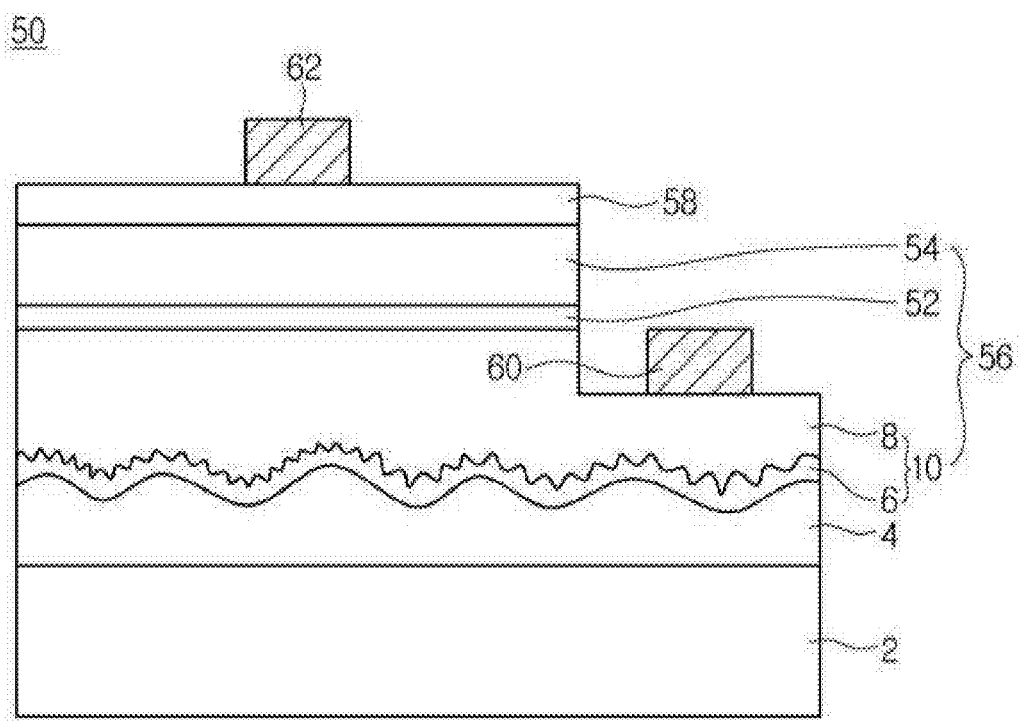
FIG. 13 is a sectional view showing a light emitting device according to the first embodiment.

FIG. 13 is a sectional view showing a light emitting device according to the first embodiment.

The light emitting device according to the first embodiment may employ at least one of the semiconductor substrates 1, 1A, 1B, 1C and 1D according to the first to fifth embodiments, but the following description will be limited to the light emitting device employing the semiconductor substrate according to the first embodiment for the purpose of convenience.

In the following description, the same reference numerals will be assigned to the same functions and shapes as those of the semiconductor substrates 1, 1A, 1B, 1C and 1D according to the first to fifth embodiments and the details thereof will be omitted.

Referring to FIG. 13, the light emitting device according to the first embodiment may include a growth substrate 2, a buffer layer 4, a conductive layer, an active layer 52, a third conductive semiconductor layer 54, a transparent electrode layer 58 and first and second electrodes 60 and 62.

The growth substrate 2, the buffer layer 4 and the conductive layer may be the semiconductor substrate according to the first embodiment, but the embodiment is not limited thereto.

The buffer layer 4, the conductive layer, the active layer 52 and the third conductive semiconductor layer 54 may be formed of group III-V or group II-VI compound semiconductor. For example, buffer layer 4, the conductive layer, the active layer 52 and the third conductive semiconductor layer 54 may include at least one selected from the group consisting of InAlGaN, GaN, AlGaN, InGaN, AlN, InN and AlInN, but the embodiment is not limited thereto.

The conductive layer may include a first conductive semiconductor layer 6 and a second conductive semiconductor layer formed on the first conductive semiconductor layer 6, but the embodiment is not limited thereto.

The first conductive semiconductor layer 6 and the second conductive semiconductor layer may be formed of compound semiconductor materials, the types of which are equal to each other, but the embodiment is not limited thereto.

The first conductive semiconductor layer 6 and/or the second conductive semiconductor layer may be formed of compound semiconductor materials, the types of which are different from each other, but the embodiment is not limited thereto.

The first conductive semiconductor layer 6 and the second conductive semiconductor layer may include dopants having the same polarity, but the embodiment is not limited thereto.

The first conductive semiconductor layer 6 and/or the second conductive semiconductor layer may include the dopants having a polarity different from that of the dopants of the third conductive semiconductor layer 54, but the embodiment is not limited thereto.

The first conductive semiconductor layer 6 and/or the second conductive semiconductor layer may include N-type dopants and the third conductive semiconductor layer 54 may include P-type dopants, but the embodiment is not limited thereto.

The N-type dopant may include at least one of Si, Ge, Sn, Se and Te, but the embodiment is not limited thereto.

The P-type dopant may include at least one of Mg, Zn, Ca, Sr and Ba, but the embodiment is not limited thereto.

The first conductive semiconductor layer 6 may include Si having a tensile stress, and the second conductive semiconductor layer may include at least one of Ge, Sn, Se and Te having a compressive stress, but the embodiment is not limited thereto.

The dopant concentration of the second conductive semiconductor layer may be 10 times to 15 times greater than that of the first conductive semiconductor layer 6, but the embodiment is not limited thereto.

The second conductive semiconductor layer may compensate for the layer quality of the first conductive semiconductor layer 6, may improve the flatness, may prevent crack from being generated and may prevent the growth substrate 2 from being broken. In addition, the second conductive semiconductor layer 8 may block the dislocations which rise up along the buffer layer 4 without being blocked by the first conductive semiconductor layer, so that the optical/electrical properties may be improved.

The light emitting structure 56 to generate light may be formed by the conductive layer, the active layer 52 and the third conductive semiconductor layer 54.

Although not shown, the conductive semiconductor layer which includes a dopant and/or one non-conductive semiconductor layer or more which does not include any dopants may be formed on the third conductive semiconductor layer 54, but the embodiment is not limited thereto.

The conductive layer may generate first carriers, that is, electrons, and the third conductive semiconductor layer 54 may generate second carriers, that is, holes, but the embodiment is not limited thereto.

The active layer 52 may emit light having a wavelength corresponding to the energy band gap difference according to materials constituting the active layer 52 through the recombination of electrons from the conductive layer and holes from the third conductive semiconductor layer 54.

The active layer 52 may have one of a multi-quantum well (MQW) structure, a quantum dot structure, and a quantum wire structure. The active layer 52 may have well layers and barrier layers repeatedly formed at one cycle of a well layer and a barrier layer. The repetition cycle of a well layer and a barrier layer may be varied depending on the characteristics of the light emitting device, but the embodiment is not limited thereto.

For example, the active layer 52 may be formed at a cycle of InGaN/GaN, a cycle of InGaN/AlGaN or a cycle of InGaN/InGaN. The bandgap of the barrier layer may be greater than that of the well layer.

The transparent electrode layer 58 may be provided on the light emitting structure 56, in detail, the third conductive semiconductor layer 54. If another conductive semiconductor layer, for example, the fourth conductive semiconductor layer is provided on the third conductive semiconductor layer 54, the transparent electrode layer 58 may be provided on the fourth conductive semiconductor layer.

The transparent electrode layer 58 may allow current to be spread or may make ohmic contact with the light emitting structure 56, so that the current may more easily flow through the light emitting structure 56, but the embodiment is not limited thereto.

The transparent electrode layer 58 may include a transparent conductive material allowing light to pass therethrough. The transparent conductive material may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO, but the embodiment is not limited thereto.

The first electrode 60 may be formed on an area of the first conductive semiconductor layer such that the first electrode 60 is electrically connected to the first conductive semiconductor layer 6, and the second electrode 62 may be formed on a portion of the transparent electrode 58 such that the second electrode 62 is electrically connected to the transparent electrode layer 58, but the embodiment is not limited thereto.

For example, the first and second electrodes 60 and 62 may include one selected from the group consisting of Al, Ti, Cr, Ni, Pt, Au, W, Cu and Mo or the multilayered structure thereof, but the embodiment is not limited thereto.

Although not shown, current blocking layers may be provided at lower portions of the first and second electrodes 60 and 62 to prevent current from being concentrated on the lower portions of the first and second electrodes 60 and 62. The size of each of the first and second electrodes 60 and 62 may be greater than the size of each current blocking layer so that the first and second electrodes 60 and 62 supply power to the first conductive semiconductor layer 6 and the transparent electrode layer 58. In addition, the first electrode 60 may be electrically connected with the first conductive semiconductor layer 6, and the second electrode 62 may be electrically connected with the transparent electrode layer 58.

For example, the first electrode 60 surrounds the current blocking layer while a rear surface of the first electrode 60 may make contact with the first conductive semiconductor layer 6. For example, the second electrode 62 surrounds the current blocking layer while a rear surface of the second electrode 62 may make contact with the transparent electrode layer 58, but the embodiment is not limited thereto.

The light emitting device according to the first embodiment may be a light emitting device having a lateral type structure in which the light generated from the active layer 52 is at least emitted forwardly through the transparent electrode layer 58.

Meanwhile, since the light generated from the active layer 52 and directed downward is scattered or reflected by the concavo-convex section formed on the top surface of the buffer layer 4 or on the top surface of the first conductive semiconductor layer 6, the light extraction efficiency may be improved.

Figure 14:
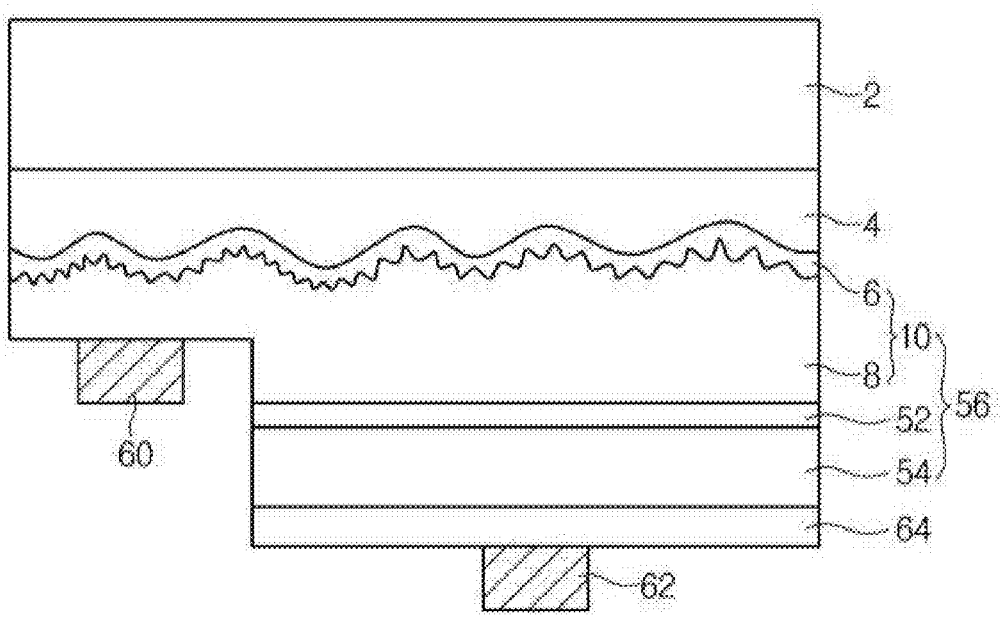
FIG. 14 is a sectional view showing a light emitting device according to the second embodiment.

FIG. 14 is a sectional view showing a light emitting device according to the second embodiment.

A light emitting device according to the second embodiment is similar to that according to the first embodiment except for a reflective electrode layer 64.

The light emitting device according to the second embodiment may be prepared by turning over the light emitting device according to the first embodiment at 180 degrees. Thus, the light emitting device according to the second embodiment may have a flip-chip type structure in which the light generated from the active layer 52 is emitted forward at least through the growth substrate 2, but the embodiment is not limited thereto.

Figure 15:
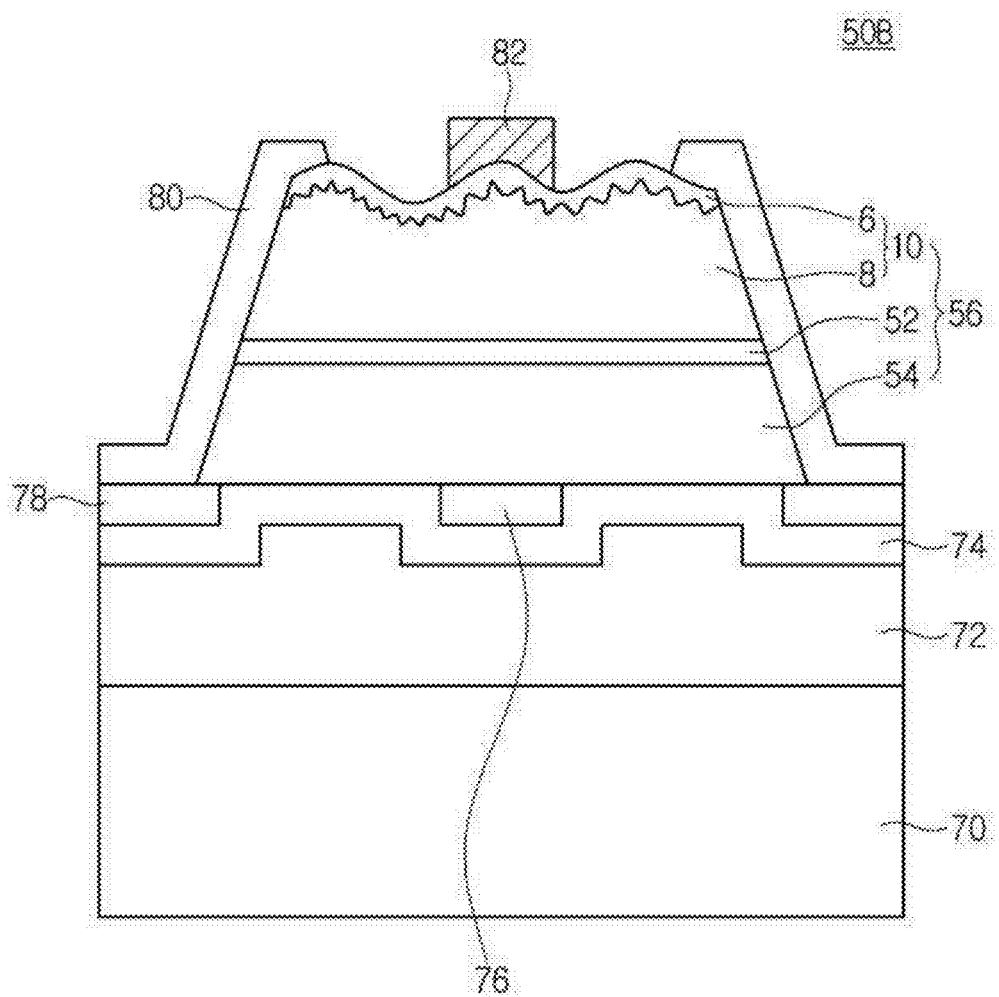
FIG. 15 is a sectional view showing a light emitting device according to the third embodiment.

Referring to FIG. 15, the light emitting device according to the first embodiment may include a growth substrate 2, a buffer layer 4, a conductive layer, an active layer 52, a third conductive semiconductor layer 54, a reflective electrode layer 64, and first and second electrodes 60 and 62.

The growth substrate 2, the buffer layer 4 and the conductive layer may be the semiconductor substrate according to the first embodiment, but the embodiment is not limited thereto.

Since the growth substrate 2 is turned over at 180 degrees, the growth substrate is placed at the uppermost position.

The reflective electrode layer 64 may be formed below the third conductive semiconductor layer 54, that is, between the third conductive semiconductor layer 54 and the second electrode 62.

The reflective electrode layer 64 may include a reflective material having an excellent reflection property, for example, at least one selected from the group consisting of Ag, Ni, Al, Rh, Pd, Ir, Ru, Mg, Zn, Pt, Au and Hf or the multilayered structure thereof, but the embodiment is not limited thereto.

When the ohmic contact characteristic of the reflective electrode layer 64 with the third conductive semiconductor layer 54 is inferior, a transparent electrode layer (not shown) may be disposed between the third conductive semiconductor layer 54 and the reflective electrode layer 64, but the embodiment is not limited thereto. The transparent electrode layer may be formed of a transparent material making excellent ohmic contact with third conductive semiconductor layer 54.

Since the reflective electrode layer 64 reflects the light generated from the active layer 52 and directed downward, the reflective electrode layer 64 may have a size equal to that of the third conductive semiconductor layer 54, but the embodiment is not limited thereto.

The size of the second electrode 62 may be at least less than that of the reflective electrode layer 64, but the embodiment is not limited thereto.

The light generated from the active layer 52 may be radiated forwardly through the growth substrate 2. Since the buffer layer 4 having a concavo-convex section or the first conductive semiconductor layer 6 is formed on the active layer 52, the extraction of light from the active layer 52 may be enhanced by the concavo-convex section and may be radiated to an outside, so that the light extraction efficiency may be improved.

Since the light generated from the active layer 52 and directed downward is scattered or reflected by the reflective electrode layer 64, the light extraction efficiency may be improved.

FIG. 15 is a sectional view showing a light emitting device according to the third embodiment.

Referring to FIG. 15, the light emitting device according to the third embodiment may include a support substrate 70, a junction layer 72, an electrode layer 74, a protective layer 78, a light emitting structure 56 and an electrode 82, but the embodiment is not limited thereto.

The light emitting structure 56 may include a conductive layer, an active layer 52 and a third conductive semiconductor layer 54, the embodiment is not limited thereto.

The conductive layer may include a first conductive semiconductor layer 6 and a second conductive semiconductor layer formed on the first conductive semiconductor layer 6, but the embodiment is not limited thereto.

The support substrate 70 may support a plurality of layers formed thereon and serve as an electrode. The support substrate 70 may include a metallic material, for example, at least one of titanium (Ti), chrome (Cr), nickel (Ni), aluminum (Al), platinum (Pt), gold (Au), tungsten (W), copper (Cu), molybdenum (Mo) and copper-tungsten (Cu—W).

The junction layer 72, which is a bonding layer, is formed between the electrode layer 74 and the support substrate 70. The junction layer 72 may serve as a medium to enhance bonding strength between the electrode layer 74 and the support substrate 70. For example, the junction layer 72 may include at least one selected from the group consisting of Ti, Au, Sn, Ni, Nb, Cr, Ga, In, Bi, Cu, Ag and Ta.

The electrode layer 74 may serve as an electrode to supply electric power to the active layer 52 and may reflect the light generated from the active layer 52 and directed downward. The electrode layer 74 may include only the reflective layer or may include a reflective layer and an ohmic contact layer, but the embodiment is not limited thereto. For example, the electrode layer 74 may include at least one selected from the group consisting of Ag, Ni, Al, Rh, Pd, Ir, Ru, Mg, Zn, Pt, Au and Hf or the multilayered structure thereof, but the embodiment is not limited thereto.

The protective layer 78 may be formed around a periphery area of the electrode layer 74 and the third conductive semiconductor layer 54. The protective layer 78 may prevent the side surfaces of the electrode layer 74 and the light emitting structure 56 from being short circuited with each other by foreign substances. The protective layer 78 may include an insulating material, for example, at least one selected from the group consisting of SiO2, SiOx, SiOxNy, Si3N4 and Al2O3, but the embodiment is not limited thereto. The protective layer 78 may include a metallic material, for example, at least one selected from the group consisting of Cu, Ag, Ni, Al, Pt and Au, but the embodiment is not limited thereto. Since the protective layer 78 serves as an electrode when the protective layer 78 is formed of a metallic material, light may be generated from the active layer 52 vertically making contact with the protective layer 78, so that the light generating area is enlarged, thereby improving the light efficiency.

The light emitting device according to the third embodiment may further include a current blocking layer 76. The current blocking layer 76, which prevents current from being vertically concentrated on the electrode 82, may be interposed between the third conductive semiconductor layer 54 and the electrode layer 74. The current blocking layer 76 may be disposed to overlap with at least a portion of the electrode 82. The current blocking layer 76 may be formed by using a material which has electrical conductivity less than or electric insulation greater than that of the electrode layer 74 or makes schottky contact with the light emitting structure 56. For example, the current blocking layer 76 may include at least one selected from the group consisting of ITO, IZO, IZTO, IAZO, IGZO, IGTO, AZO, ATO, ZnO, SiO2, SiOx, SiOxNy, Si3N4, Al2O3, TiOx, Ti, Al and Cr. The SiO2, SiOx, SiOxNy, Si3N4 and Al2O3 may be insulating materials.

The light emitting device according to the third embodiment may further include an insulating layer 80. That is, the insulating layer 80 may be provided around a side surface of the light emitting structure 56. One portion of the insulating layer 80 may make contact with one portion of the protective layer 78 and another portion may make contact with a portion of the buffer layer 4. The insulating layer 80 may prevent the light emitting structure 56 and the support substrate 70 from being short circuited with each other. For example, the insulating layer 80 may include an insulating material including at least one selected from the group consisting of SiO2, SiOx, SiOxNy, Si3N4, TiO2 and Al2O3, but the embodiment is not limited thereto. The insulating layer 80 may include the same material as the protective layer 78, but the embodiment is not limited thereto.

A light extracting structure including a concavo-convex section may be formed on each top surface of the first conductive semiconductor layer 6 and the buffer layer 4. As described in the semiconductor substrates 1, 1A, 1B, 1C and 1D according to the first to fifth embodiments, the light extracting structure may have a concavo-convex section formed on the surface of the buffer layer 4 by Al of the buffer layer 4 and by the concavo-convex section, a concavo-convex section may be also formed on the surface of the first conductive semiconductor layer form on the concavo-convex section.

A size of the concavo-convex section formed on the top surface of the buffer layer 4 may be greater than that formed on the top surface of the first conductive semiconductor layer 6, but the embodiment is not limited thereto.

The light extraction efficiency may be improved due to the light extracting structures formed on the first conductive semiconductor layer 6 and the buffer layer 4, respectively.

In addition, the light extracting structure is not intentionally formed through an additional process but may be formed by using a kind of compound semiconductor material included in the buffer layer 4 or a thickness control of the buffer layer 4, so that the fabrication process of the light emitting device according to the third embodiment may be simplified and the fabrication cost and time may be reduced.

The electrode 82 may be provided on the light extracting structure. For example, the electrode 82 may include one selected from the group consisting of Al, Ti, Cr, Ni, Pt, Au, W, Cu and Mo or the multilayered structure thereof, but the embodiment is not limited thereto.

The semiconductor substrates 1, 1A, 1B, 1C and 1D according to the first to fifth embodiments may be employed in an electronic device.

The light emitting device according to the third embodiment may be a vertical type structure light emitting device, but the embodiment is not limited thereto.

Figure 16:
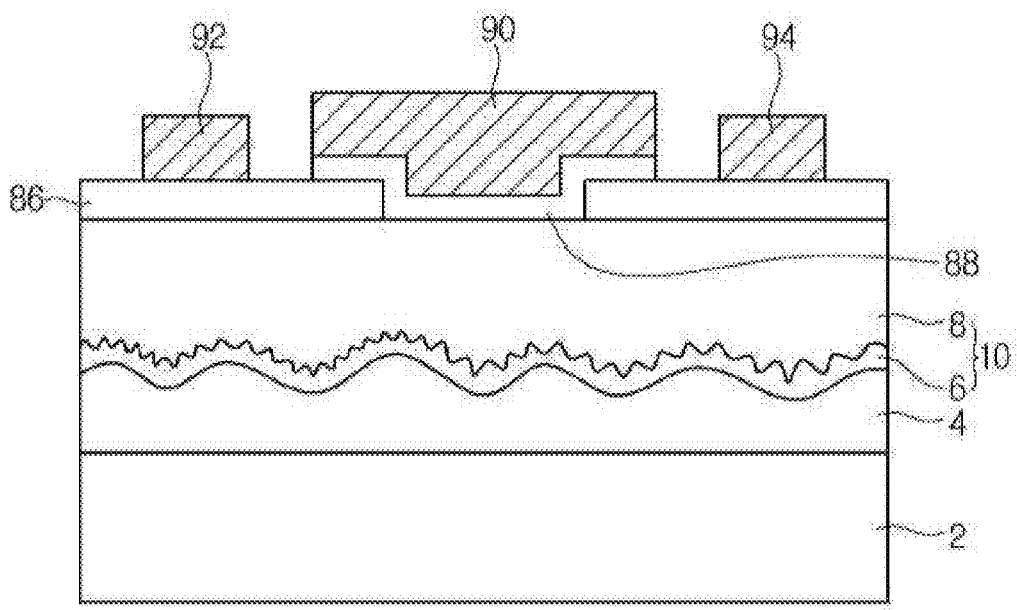
FIG. 16 is a sectional view showing a MOSFET according to an embodiment.

FIG. 16 is a sectional view showing a MOSFET according to an embodiment.

The MOSFET, which is a switching device, is a kind of electronic device.

Referring to FIG. 16, the MOSFET according to the embodiment may include a growth substrate 2, a conductive layer, a third conductive semiconductor layer 86, a channel layer 88, a gate electrode 90, a drain electrode 94 and a source electrode 92.

The conductive layer may include a first conductive semiconductor layer 6 and a second conductive semiconductor layer formed on the first conductive semiconductor layer 6.

Each of the first conductive layer 6 and the second conductive semiconductor layer may be an N-type semiconductor layer including an N-type dopant, but the embodiment is not limited thereto.

The third conductive semiconductor layer 86 may be a P-type semiconductor layer including a P-type dopant, but the embodiment is not limited thereto.

The third conductive semiconductor layer 86 may be formed on both side areas of the conductive layer, but the embodiment is not limited thereto.

A rear surface of the third conductive semiconductor layer 86 may make contact with the conductive layer, but the embodiment is not limited thereto.

The channel layer 88 may be formed on a central area of the conductive layer, that is, on the conductive layer between the third conductive semiconductor layers 86 adjacent to each other. The channel layer 88 may make contact with the top surface of the conductive layer and may make contact with a portion of the top surface and the side surface of the third conductive semiconductor layer 86, but the embodiment is not limited thereto.

A gate electrode 90 may be formed on the channel layer 88, and a source electrode 92 and a drain electrode 94 may be formed on the adjacent third conductive semiconductor layers 86, respectively.

A size of the gate electrode 90 may be equal to that of the channel layer 88, but the embodiment is not limited thereto.

The source and drain electrodes 92 and 94 may be spaced apart from the gate electrode 90, respectively. The source and drain electrodes 92 and 94 may be formed on a portion of the third conductive semiconductor layer 86, respectively, but the embodiment is not limited thereto.

The channel layer 88 may be turned on through a control signal provided to the gate electrode 90, so that a signal may be transferred from the drain electrode 94 to the source electrode 92.

The MOSFET according to the embodiment is fabricated based on nitride semiconductor, so that the MOSFET is enabled to be switched at a high speed since the electron mobility is significantly greater than that of a Si-based MOSFET according to the related art.

According to the MOSFET of the embodiment, for example, a Ge-based second conductive semiconductor layer, which enables planarization and dislocation blocking, is formed on the Si-based first conductive semiconductor layer 6 which serves as the conductive layer, so that the crystallinity of the conductive layer may be improved, so the electrical property of the MOSFET may be improved.

According to the embodiment, since the second conductive semiconductor layer including the dopant having a compressive stress is formed on the first conductive semiconductor layer including the dopant having a tensile stress, the balance of stress is maintained when the cooling down is performed in the subsequent process, so that the substrate can be prevented from being broken or crack can be reduced in the semiconductor layer.

According to the embodiment, the second conductive semiconductor layer including the dopant having an excellent flatness is formed on the first conductive semiconductor layer including the dopant having a poor flatness, so that the electrical/optical properties can be improved due to the improvement of crystallinity.

According to the embodiment, the second conductive semiconductor layer, to which an LOG technique is applied, is formed on the buffer layer having a concavo-convex section and the first conductive semiconductor layer formed on the buffer layer, so that the dislocation rising up along the first conductive semiconductor layer may be blocked.

According to the embodiment, since the non-conductive semiconductor layer which can improve flatness is formed on the first conductive layer, the flatness of the second conductive layer formed on the non-conductive semiconductor layer may also be improved, so that the crystallinity may be improved, thereby improving the electrical/optical properties.

The embodiment provides a semiconductor substrate capable of improving the crystallinity by preventing a dislocation.

The embodiment provides a semiconductor substrate capable of increasing the yield by controlling strain to prevent a crack.

The embodiment provides a semiconductor substrate capable of improving electrical and optical properties of a light emitting device or an electronic device through the doping at a high concentration of a dopant.

The embodiment provides a light emitting device.

The embodiment provides an electronic device using a semiconductor substrate.

According to the embodiment, there is provided a light emitting device including a substrate; a buffer layer on the substrate; a first conductive layer on the buffer layer; an active layer on the first conductive layer; and a third conductive semiconductor layer on the active layer, wherein the first conductive layer includes a first conductive semiconductor layer including a first dopant having a tensile stress, and a second conductive semiconductor layer provided on the first conductive semiconductor layer and including a second dopant having a compressive stress.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a substrate;
a buffer layer on the substrate, wherein a surface of the buffer layer includes a concavo-convex section;
a first conductive layer on the buffer layer;
a non-conductive semiconductor layer on the first conductive layer;
a second conductive layer on the non-conductive semiconductor layer;
an active layer on the second conductive layer;
a third conductive semiconductor layer on the active layer; and
a transparent layer on the third conductive semiconductor layer,
wherein the first conductive layer includes a first conductive semiconductor layer having a first dopant and a prescribed tensile stress and a second conductive semiconductor layer provided on the first conductive semiconductor layer, the second conductive semiconductor layer having a second dopant and a prescribed compressive stress, wherein the first conductive semiconductor layer has a shape corresponding to the concavo-convex section.

2. The light emitting device of claim 1, wherein the second conductive semiconductor layer has a surface including a concavo-convex section, and a size of the concavo-convex section formed in the surface of the second conductive semiconductor layer is less than the concavo-convex section of the first conductive semiconductor layer.

3. The light emitting device of claim 1, wherein the first dopant includes Si, and the second dopant includes at least one of Si, Ge, Sn, Se and Te.

4. The light emitting device of claim 1, wherein a thickness of each of the first and second conductive semiconductor layers is in a range of 10 nm to 5 μm.

5. The light emitting device of claim 1, wherein a concentration of the second conductive semiconductor layer is 10 times to 15 times greater than a concentration of the first conductive semiconductor layer.

6. The light emitting device of claim 1, further comprising a plurality of conductive layers on the first conductive layer.

7. The light emitting device of claim 1, wherein the substrate has a flat top surface adjacent a flat bottom surface of the buffer layer.

8. The light emitting device of claim 7, wherein a top surface of the buffer layer is adjacent to a bottom surface of the first conductive semiconductor layer, and a top surface of the first conductive semiconductor layer is adjacent a bottom surface of the second conductive semiconductor layer, wherein the top surface of the buffer layer is a concavo-convex surface, the top surface of the first conductive semiconductor layer is a concavo-convex surface and the bottom surface of the second conductive semiconductor layer is a concavo-convex surface, and a size of the concavo-convex surface of the second conductive semiconductor layer is less than a size of the concavo-convex surface of the first conductive semiconductor layer.

9. A light emitting device comprising:
a substrate;
a buffer layer on the substrate;
a first conductive layer on the buffer layer;
a non-conductive semiconductor layer on the first conductive layer;
a second conductive layer on the non-conductive semiconductor layer; and
an active layer on the second conductive layer;
a third conductive semiconductor layer on the active layer; and
a transparent electrode layer on the third conductive semiconductor layer,
wherein the first and second conductive layers includes a first conductive semiconductor layer, and a second conductive semiconductor layer provided on the first conductive semiconductor layer and including Si and Ge, and
a concentration of the Si is gradually decreased from 100% to 0% in a thickness direction of the second conductive semiconductor layer, and a concentration of the Ge is gradually increased from 0% to 100% in the thickness direction of the second conductive semiconductor layer.

10. The light emitting device of claim 9, wherein the concentration of the Si is linearly decreased in the thickness direction of the second conductive semiconductor layer, and the concentration of the Ge is linearly increased in the thickness direction of the second conductive semiconductor layer.

11. The light emitting device of claim 9, wherein the concentration of the Si is non-linearly decreased in the thickness direction of the second conductive semiconductor layer, and the concentration of the Ge is non-linearly increased in the thickness direction of the second conductive semiconductor layer.

12. The light emitting device of claim 11, wherein the concentration of the Si is non-linearly decreased in a downwardly concave form, and the concentration of the Ge is non-linearly increased in a downwardly concave form.

13. The light emitting device of claim 11, wherein the concentration of the Si is non-linearly decreased in an upwardly convex form, and the concentration of the Ge is non-linearly increased in an upwardly convex form.

14. The light emitting device of claim 9, wherein the concentration of the Si is decreased stepwise in the thickness direction of the second conductive semiconductor layer, and the concentration of the Ge is increased stepwise in the thickness direction of the second conductive semiconductor layer.

15. The light emitting device of claim 9, wherein the non-conductive semiconductor has a lower area including Ge, and an upper area including Si.

16. A light emitting device comprising:
a substrate;
a buffer layer on the substrate;
a first conductive layer on the buffer layer;
a non-conductive semiconductor layer on the first conductive layer;
a second conductive layer on the non-conductive semiconductor layer;
an active layer on the second conductive layer;
a third conductive semiconductor layer on the active layer; and
a transparent electrode layer on the third conductive semiconductor layer,
wherein the first and second conductive layers includes:
a first conductive semiconductor layer having a first dopant and a prescribed tensile stress, and
a second conductive semiconductor layer provided on the first conductive semiconductor layer, the second conductive semiconductor layer having a second dopant and a prescribed compressive stress.

17. The light emitting device of claim 16, wherein the non-conductive semiconductor layer includes at least one selected from the group consisting of InAlGaN, GaN, AlGaN, InGaN, AlN, InN and AlInN.

18. The light emitting device of claim 17, wherein a surface of the buffer layer includes a concavo-convex section.

19. The light emitting device of claim 18, wherein a surface roughness of the non-conductive semiconductor layer is less than a surface roughness of the second conductive semiconductor layer.

20. The light emitting device of claim 19, wherein the non-conductive semiconductor layer and a conductive layer are alternately disposed on the second conductive layer.

* * * * *